United States Patent
Mochizuki

(10) Patent No.: US 11,037,810 B2
(45) Date of Patent: Jun. 15, 2021

(54) TEACHING METHOD

(71) Applicant: TOKYO ELECTRON LIMITED, Tokyo (JP)

(72) Inventor: Takamitsu Mochizuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 387 days.

(21) Appl. No.: 16/209,801

(22) Filed: Dec. 4, 2018

(65) Prior Publication Data
US 2019/0172742 A1 Jun. 6, 2019

(30) Foreign Application Priority Data
Dec. 6, 2017 (JP) .............................. JP2017-234484

(51) Int. Cl.
*H01L 21/68* (2006.01)
*B25J 9/16* (2006.01)
*H01L 21/67* (2006.01)
*H01L 21/677* (2006.01)

(52) U.S. Cl.
CPC .......... *H01L 21/681* (2013.01); *B25J 9/1628* (2013.01); *B25J 9/1679* (2013.01); *B25J 9/1697* (2013.01); *H01L 21/67259* (2013.01); *H01L 21/67742* (2013.01); *H01L 21/67748* (2013.01); *H01L 21/67167* (2013.01)

(58) Field of Classification Search
CPC ...... B25J 9/1628; B25J 9/1679; B25J 9/1697; H01L 21/681; H01L 21/67259; H01L 21/67748; H01L 21/67742; H01L 21/67167

See application file for complete search history.

(56) References Cited

U.S. PATENT DOCUMENTS

| 9,355,442 B2 * | 5/2016 | Iwanaga | G06T 7/0004 |
| 10,520,450 B2 * | 12/2019 | Mori | H01L 22/20 |
| 2003/0012631 A1 * | 1/2003 | Pencis | H01L 21/67103 |
| | | | 414/744.5 |
| 2005/0255609 A1 * | 11/2005 | Kumagai | H01L 21/67259 |
| | | | 438/5 |

(Continued)

FOREIGN PATENT DOCUMENTS

| JP | 4813765 B2 | 11/2011 |
| JP | 2014-128855 A | 7/2014 |

(Continued)

*Primary Examiner* — Seahvosh Nikmanesh
(74) *Attorney, Agent, or Firm* — Fenwick & West LLP

(57) ABSTRACT

In a teaching method for a transfer mechanism that transfers a substrate to a mounting table, the method includes: transferring an inspection substrate having a plurality of imaging devices on an outer peripheral edge thereof to a transfer position where the substrate is transferred between the transfer mechanism and the mounting table; imaging a part of the mounting table which includes an outer periphery of the mounting table at the transfer position by the imaging devices; calculating a central position of the mounting table based on the image obtained by the imaging devices; and correcting the transfer position based on the central position of the mounting table which is calculated in the calculating and a central position of the inspection substrate at the transfer position.

12 Claims, 6 Drawing Sheets

(56) References Cited

U.S. PATENT DOCUMENTS

| | | | |
|---|---|---|---|
| 2007/0189596 A1* | 8/2007 | Lee | G06T 7/74 |
| | | | 382/151 |
| 2009/0085594 A1* | 4/2009 | Yamamoto | G01R 31/2891 |
| | | | 324/762.05 |
| 2010/0030347 A1* | 2/2010 | Shindo | H01L 21/67259 |
| | | | 700/59 |
| 2010/0154826 A1* | 6/2010 | Printz | H01L 21/67253 |
| | | | 134/18 |
| 2011/0050882 A1* | 3/2011 | Lee | H01L 21/681 |
| | | | 348/95 |
| 2011/0262004 A1* | 10/2011 | Murakami | B66C 13/48 |
| | | | 382/103 |
| 2019/0251210 A1* | 8/2019 | Pivac | B25J 9/1651 |
| 2019/0355604 A1* | 11/2019 | Kawabe | H01L 21/67259 |
| 2020/0013657 A1* | 1/2020 | Lee | H01L 21/67242 |
| 2020/0254615 A1* | 8/2020 | Bryner | B25J 9/1602 |
| 2020/0350852 A1* | 11/2020 | De Santi | H01L 31/18 |
| 2021/0035831 A1* | 2/2021 | Arakane | H01L 21/67259 |

FOREIGN PATENT DOCUMENTS

| | | |
|---|---|---|
| KR | 10-2009-0051423 A | 5/2009 |
| KR | 10-2013-0125158 A | 11/2013 |
| WO | WO 09/067183 A2 | 8/2003 |

\* cited by examiner

TEACHING METHOD

CROSS-REFERENCE TO RELATED APPLICATIONS

This application claims priority to Japanese Patent Application No. 2017-234484 filed on Dec. 6, 2017, the entire contents of which are incorporated herein by reference.

FIELD OF THE INVENTION

The present disclosure relates to a teaching method.

BACKGROUND OF THE INVENTION

In manufacturing semiconductor devices, a substrate processing system including a transfer mechanism for transferring a substrate between a plurality of modules is used. In the substrate processing system, the transfer mechanism loads the substrate into each module, and delivers the substrate to lift pins protruding from a mounting table disposed in each module.

In such a substrate processing system, an operator teaches transfer information such as a substrate mounting position in each module or the like to the transfer mechanism by using an inspection substrate in order to accurately transfer the substrate into each module. As for the inspection substrate, a wireless substrate-shaped sensor on which a camera is mounted is known (see, e.g., Japanese Patent Application Publication No. 4813765).

In a conventional teaching method, a mounting table is subjected to treatment such as formation of an imaging pattern (target) on the mounting table as a teaching target, or the like. However, in the case of a mounting table used in a process module for processing the substrate, it may be difficult to perform the treatment on the mounting table since it may affect a processing result.

SUMMARY OF THE INVENTION

In view of the above, the present disclosure provides a teaching method capable of teaching a transfer position for transferring a substrate between a transfer mechanism and a mounting table without performing treatment on the mounting table.

In accordance with an aspect, there is provided a teaching method for a transfer mechanism that transfers a substrate to a mounting table, the method including: transferring an inspection substrate having a plurality of imaging devices on an outer peripheral edge thereof to a transfer position where the substrate is transferred between the transfer mechanism and the mounting table; imaging a part of the mounting table which includes an outer periphery of the mounting table at the transfer position by the imaging devices; calculating a central position of the mounting table based on the image obtained by the imaging devices; and correcting the transfer position based on the central position of the mounting table which is calculated in the calculating and a central position of the inspection substrate at the transfer position.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
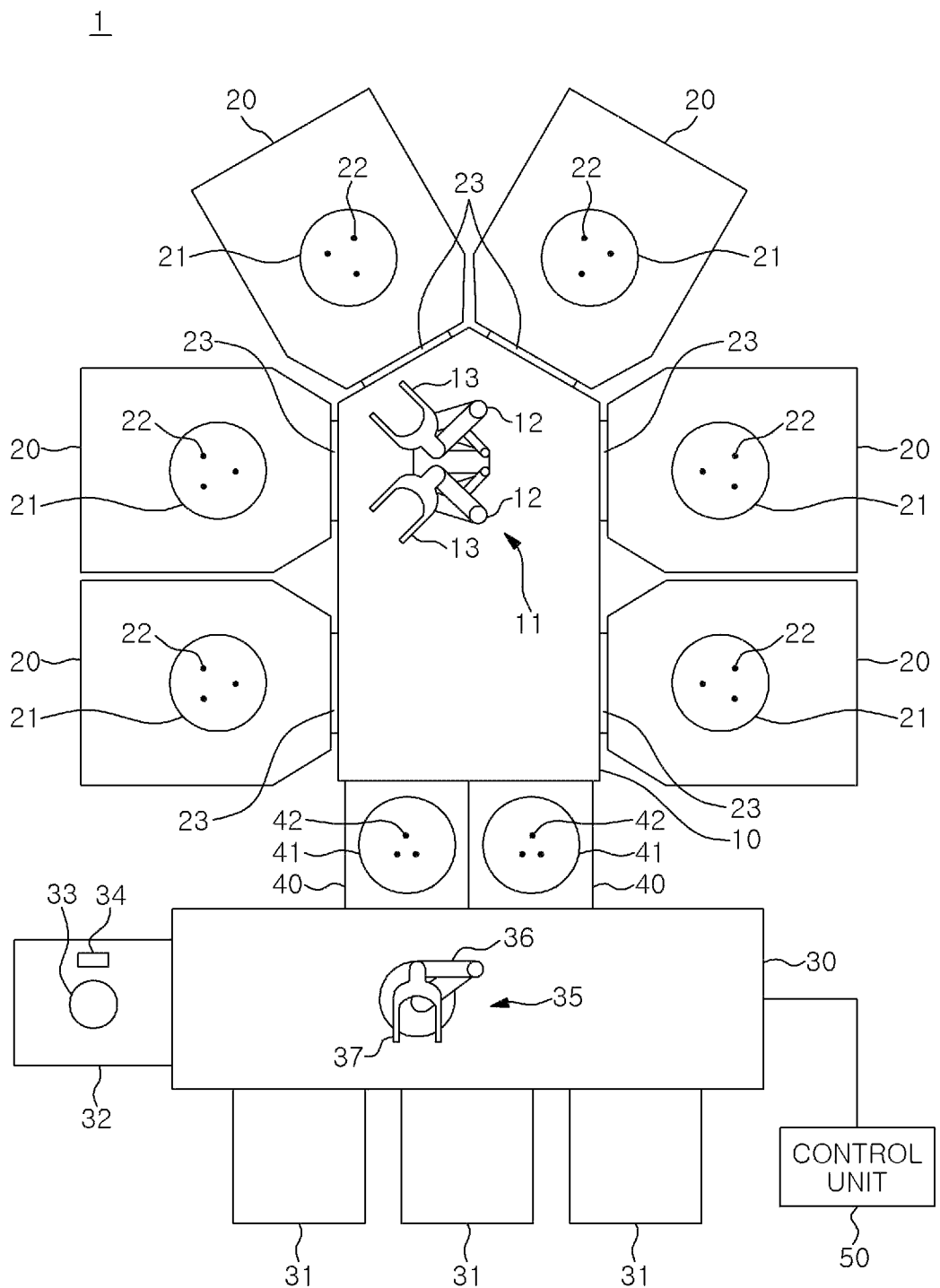
FIG. 1 schematically shows an example of a substrate processing system to which a teaching method according to an embodiment is applied.

Hereinafter, embodiments will be described in detail with reference to the accompanying drawings. Like reference numerals will be given to like or corresponding parts throughout the drawings, and redundant description thereof will be omitted.

(Substrate Processing System)

A substrate processing system capable of performing various processes such as plasma processing and the like on a semiconductor wafer (hereinafter referred to as "wafer") one at a time will be described as an example of a substrate processing system to which a teaching method according to an embodiment of the present disclosure is applied.

FIG. 1 schematically shows an example of a substrate processing system to which a teaching method according to an embodiment of the present disclosure is applied. In FIG. 1, a ceiling plate of each module of the substrate processing system and the like are omitted.

As shown in FIG. 1, the substrate processing system 1 includes a transfer module 10, six process modules 20, a loader module 30, and two load-lock modules 40.

The transfer module 10 has a substantially pentagonal shape when viewed from the top. The transfer module 10 is a vacuum chamber and has therein a transfer mechanism 11. The transfer mechanism 11 has a guide rail (not shown), two arms 12, and a fork 13 disposed at the tip of each arm 12 to support a wafer. Each arm 12 is of a SCARA arm type, and is configured to be rotatable, extensible and contractible. The transfer mechanism 11 moves along the guide rail and transfers a wafer between the process modules 20 and the load-lock modules 40. The transfer mechanism 11 does not necessarily have the configuration shown in FIG. 1 as long as the wafer can be transferred between the process modules 20 and the load-lock modules 40. For example, each arm 12 of the transfer mechanism 11 may be configured to be rotatable, extensible/contractible, and vertically movable.

The process modules 20 are radially arranged around the transfer module 10 and connected to the transfer module 10. Each process module 20 is a processing chamber and includes a cylindrical stage 21 therein. The stage 21 is provided with three thin bar-shaped lift pins 22 that can protrude beyond and retract below an upper surface of the stage 21. The lift pins 22 are arranged on the same circumference when viewed from the top. When the lift pins 22 protrude beyond the upper surface of the stage 21, the wafer mounted on the stage 21 is lifted and supported by the lifter pins 22. When the lift pins 22 retract below the upper surface of the stage 21, the wafer is mounted on the stage 21. After the wafer is mounted on the stage 21, a pressure in the process module 20 is decreased and a processing gas is introduced into the process module 20. Plasma is generated by applying a high frequency power into the process module 20, and plasma processing is performed on the wafer by the plasma thus generated. The transfer module 10 and the process modules 20 are partitioned by openable/closeable gate valves 23.

The loader module 30 is arranged to face the transfer module 10. The loader module 30 is a rectangular parallelepiped-shaped atmospheric transfer chamber maintained in an atmospheric pressure atmosphere. Two load-lock modules 40 are connected to one long side of the loader module 30. Three load ports 31 are connected to the other long side of the loader module 30. A FOUP (Front Opening Unified Pod) (not shown) that is a container for accommodating a plurality of wafers is mounted on each load port 31. An aligner 32 is connected to one short side of the loader module 30. A transfer mechanism 35 is provided in the loader module 30.

The aligner 32 aligns the wafer. The aligner 32 has a rotating stage 33 rotated by a driving motor (not shown). The rotating stage 33 has a diameter smaller than the diameter of the wafer and is configured to be rotatable in a state where the wafer is mounted on the upper surface thereof. An optical sensor 34 for detecting an outer peripheral edge of the wafer is provided near the rotating stage 33. In the aligner 32, a central position of the wafer and a direction of a notch with respect to the central position of the wafer are detected by the optical sensor 34. The wafer is delivered to a fork 37 to be described later such that the central position of the wafer becomes a specified position and the direction of the notch becomes a specified direction. Accordingly, the transfer position of the wafer is adjusted such that the central position of the wafer becomes the specified position and the direction of the notch in the load-lock module 40 becomes the specified direction.

The transfer mechanism 35 includes a guide rail (not shown), an arm 36, and the fork 37. The arm 36 is of a SCARA arm type, and is configured to be movable along the guide rail and also rotatable, extensible/contractible and vertically movable. The fork 37 is disposed at the tip of the arm 36 and supports the wafer. In the loader module 30, the transfer mechanism 35 transfers the wafer between the FOUP mounted on each load port 31, the aligner 32 and the load-lock modules 40. The transfer mechanism 35 does not necessarily have the configuration shown in FIG. 1 as long as the wafer can be transferred between the FOUP, the aligner 32 and the load-lock modules 40.

The load-lock modules 40 are disposed between the transfer module 10 and the loader module 30. Each load-lock module 40 is a chamber of which inner pressure can be switched between a vacuum state and an atmospheric pressure, and has a cylindrical stage 41 therein. In the case of loading the wafer from the loader module 30 into the transfer module 10, the wafer is transferred from the loader module 30 into the load-lock module 40 maintained at an atmospheric pressure; the pressure in the load-lock module 40 is decreased; and the wafer is loaded into the transfer module 10. In the case of unloading the wafer from the transfer module 10 to the loader module 30, the wafer is transferred from the transfer module 10 into the load-lock module 40 maintained in a vacuum state; the pressure in the load-lock module 40 is increased to an atmospheric pressure; and the wafer is loaded into the loader module 30. The stage 41 is provided with three thin bar-shaped lift pins 42 that can protrude beyond and retract below the upper surface of the stage 41. The lift pins 42 are arranged on the same circumference when viewed from the top. When the lift pins 42 protrude beyond the upper surface of the stage 41, the wafer is lifted and supported by the lift pins 42. When the lift pins 42 retract below the upper surface of the stage 41, the wafer is mounted on the stage 41. The load-lock modules 40 and the transfer module 10 are partitioned by openable and closeable gate valves (not shown). Further, the load-lock modules 40 and the loader module 30 are partitioned by openable and closeable gate valves (not shown).

The substrate processing system 1 includes a control unit 50. The control unit 50 is, e.g., a computer, and includes a CPU (Central Processing Unit), a RAM (Random Access Memory), a ROM (Read Only Memory), an auxiliary storage device, and the like. The CPU operates based on the program stored in the ROM or the auxiliary storage device and controls operations of the respective components of the substrate processing system.

(Teaching Method)

Figure 2:
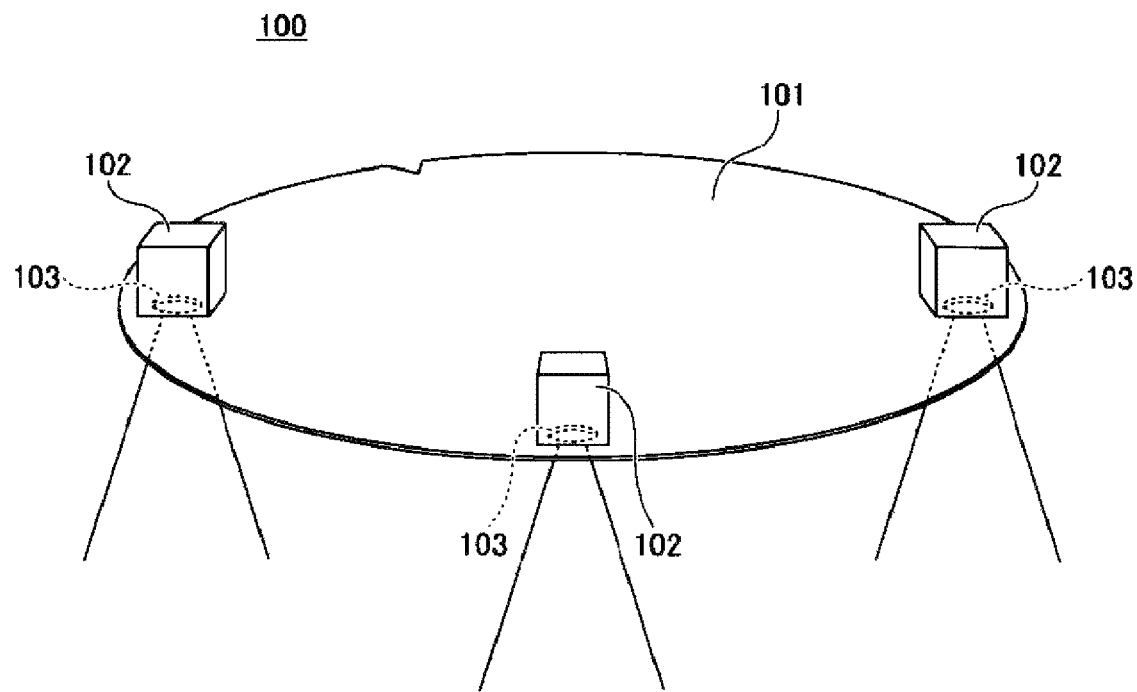
FIG. 2 shows an example of an inspection wafer.
Figure 3A:
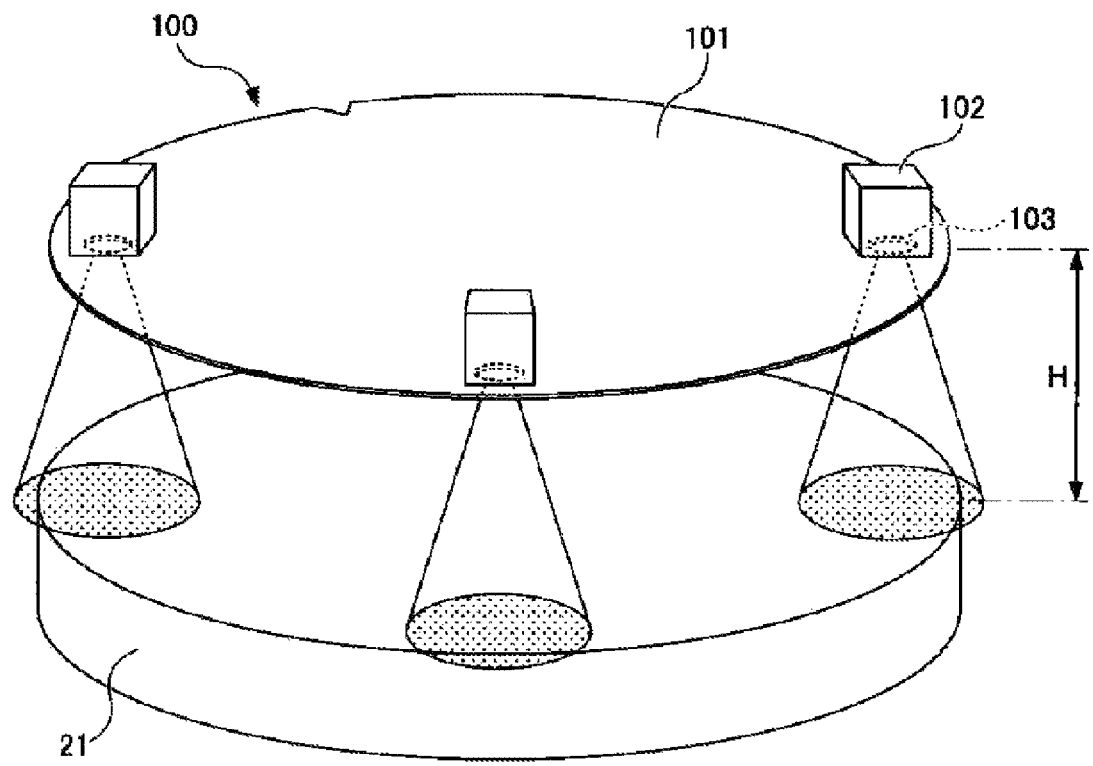
FIGS. 3A and 3B explain positional relation between a stage and the inspection wafer at a transfer position.
Figure 3B:
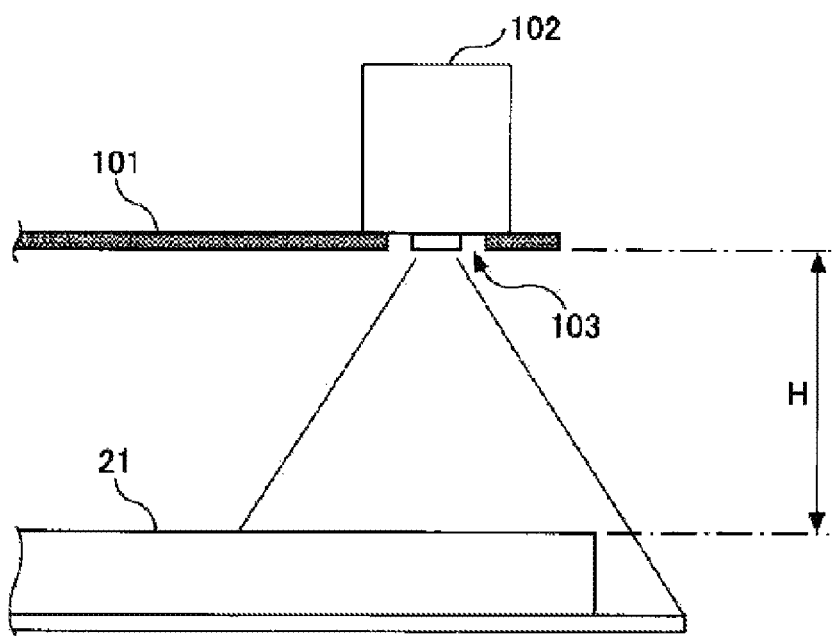

Hereinafter, a teaching method according to an embodiment of the present disclosure will be described. FIG. 2 explains an inspection wafer. FIGS. 3A and 3B explain positional relation between the stage and the inspection wafer at the transfer position. FIG. 3B is an enlarged cross sectional view showing a part of the configuration shown in FIG. 3A. In the following description, the operations of the respective components of the substrate processing system 1 are controlled by the control unit 50.

First, the FOUP accommodating therein the inspection wafer 100 is mounted on the load port 31. As shown in FIG. 2, the inspection wafer 100 includes a base wafer 101 and a plurality of (e.g., three) cameras 102. The base wafer 101 preferably has the same size as that of a product wafer. By using the base wafer 101 having the same size as that of the product wafer, the inspection wafer 100 can be transferred between the modules in the same manner as in the case of the product wafer. Specifically, in the case of using a product wafer having a diameter of 300 mm, for example, the base wafer 101 preferably has a diameter of 300 mm. The cameras 102 are arranged on the outer peripheral portion, for example, on the same circumference, of the surface of the base wafer 101. Each camera 102 is configured to image a lower side of the base wafer 101 through an opening 103 formed in the base wafer 101. The number of cameras is not limited and may be two or more. The inspection wafer 100 may have a storage unit for storing images obtained by the cameras 102.

Next, the inspection wafer 100 is position-aligned (position alignment step). In the position alignment step, the fork 37 of the transfer mechanism 35 enters the FOUP, lifts and supports the inspection wafer 100, and retreats from the FOUP. Next, the fork 37 supporting the inspection wafer 100 enters the aligner 32 and is lowered to mount the inspection wafer 100 on the rotating stage 33. Then, the fork 37 retreats from the aligner 32, and the inspection wafer 100 is position-aligned by the aligner 32. After the inspection wafer 100 is position-aligned, the fork 37 enters the aligner 32 and lifts and supports the inspection wafer 100. Then, the fork 37 retreats from the aligner 32. At this time, since the inspection wafer 100 is position-aligned, the inspection wafer 100 is delivered to the fork 37 such that the central position of the inspection wafer 100 becomes the specified position and the direction of the notch becomes the specified direction. When the position-alignment of the inspection wafer 100 has been performed in advance, the position alignment step may be omitted.

Next, the fork 37 supporting the inspection wafer 100 enters the load-lock module 40 maintained at an atmospheric pressure and, then, the three lift pins 42 protrude beyond the upper surface of the stage 41 to lift and separate the inspection wafer 100 from the fork 37. Next, the fork 37 retreats from the load-lock module 40 and the three lift pins 42 retract below the upper surface of the stage 41 to mount the inspection wafer 100 on the stage 41. At this time, since the inspection wafer 100 is delivered to the fork 37 such that the central position of the inspection wafer 100 becomes the specified position and the direction of the notch becomes the specified direction, the central position of the wafer becomes the predetermined position and the direction of the notch in the load-lock module 40 becomes the predetermined direction.

Next, the pressure in the load-lock module 40 is decreased, and the three lift pins 42 protrude beyond the upper surface of the stage 41 to lift the inspection wafer 100. Thereafter, the fork 13 of the transfer mechanism 11 enters the load-lock module 40 and, then, the three lift pins 42 are lowered to allow the inspection wafer 100 to be supported by the fork 13.

Next, the fork 13 supporting the inspection wafer 100 enters the process module 20 and stops at a transfer position where the wafer is transferred between the fork 13 of the transfer mechanism 11 and the lift pins 22 of the stage 21 (transfer step). As shown in FIGS. 3A and 3B, for example, the transfer position is separated upward by a predetermined distance H from the wafer mounting surface of the stage 21. At this time, since the inspection wafer 100 has been position-aligned in the position alignment step, the positions of the cameras 102 arranged on the inspection wafer 100 to be mounted on the stage 21 are determined as specified positions.

Next, at the transfer position, a part of the stage 21 which includes the outer periphery of the stage 21 is imaged by the cameras 102 installed at the inspection wafer 100 (imaging step). In the imaging step, different portions of the stage 21 are simultaneously imaged by the cameras 102. Next, the cameras 102 transmit identification information (e.g., camera IDs) and the images of the stage 21 to the external control unit 50. When the cameras 102 do not have a communication function, a communication device may be installed in addition to the cameras 102 at the inspection wafer 100 and the images of the stage 21 obtained by the cameras 102 may be transmitted to the control unit 50.

Figure 4:
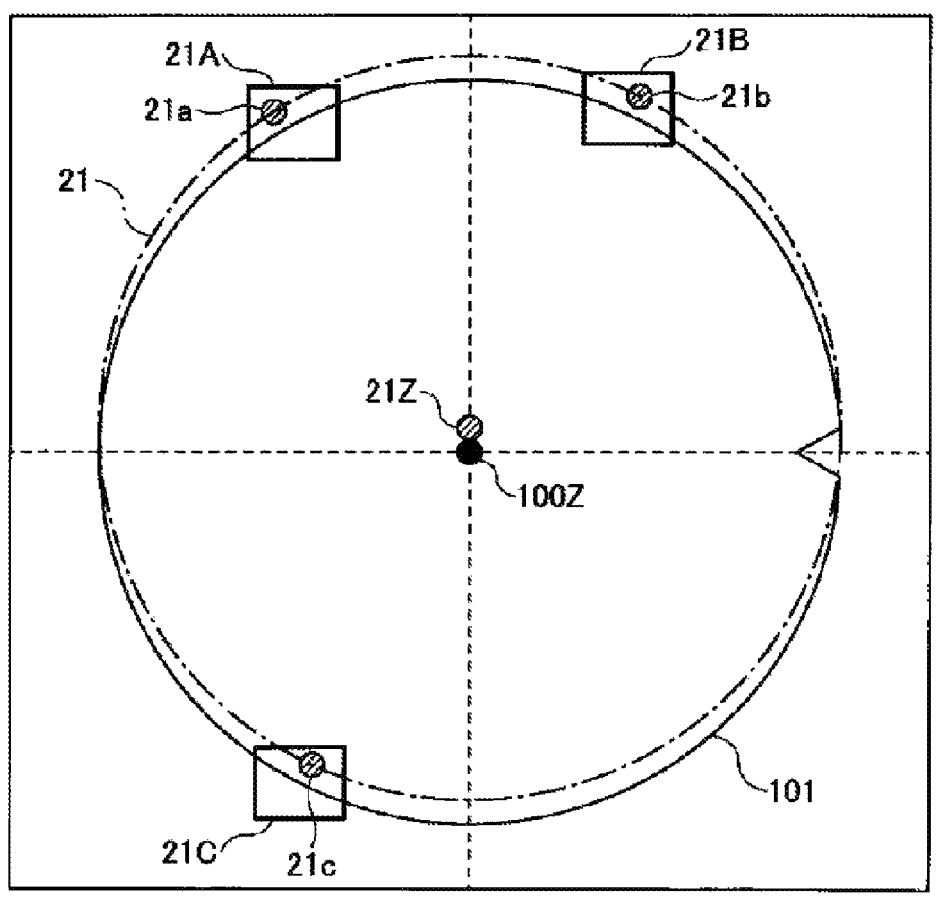
FIG. 4 explains a method for calculating a central position of the stage from a captured image.

Next, the control unit 50 calculates a central position 21Z of the stage 21 based on the images of the stage 21 obtained by the cameras 102 (calculation step). FIG. 4 explains a method for calculating the central position of the stage 21 from the captured images. In FIG. 4, the stage 21 is indicated by a dashed dotted line, and the inspection wafer 100 (the base wafer 101) is indicated by a solid line. For example, when three cameras 102a, 102b and 102c are installed at the inspection wafer 100, the central position 21Z of the stage 21 is obtained by algebraic calculation using position coordinates of three points 21a, 21b and 21c (see FIG. 4) on the circumference included in images 21A, 21B and 21C (see FIG. 4) of the stage 21 obtained by the three cameras 102a to 102c. At this time, since the images are obtained in a state where the positions of the cameras 102 are determined as the specified positions, the position coordinates of the images 21A to 21C are determined as specified coordinates. Accordingly, the position coordinates of the three points 21a to 21c on the outer periphery included in the images 21A to 21C can be calculated. When two cameras 102 are installed at the inspection wafer 100, the central position of the stage 21 is obtained by algebraic calculation using position coordinates of two points on the outer periphery of the stage 21 and a radius (or diameter) of the stage 21. The radius (or diameter) of the stage 21 may be stored in advance in the storage device or may be inputted by an operator.

Next, the control unit 50 corrects the transfer position based on the central position 21Z of the stage 21 calculated in the calculation step and a central position 100Z of the inspection wafer 100 at the transfer position (correction step). Specifically, when the central position 21Z of the stage 21 calculated in the calculation step does not coincide with the central position 100Z of the inspection wafer 100 at the transfer position, the correction amount is calculated to make the central position 100Z coincide with the central position 21Z. The calculated correction amount is stored in the storage device. The control unit 50 may move the fork 13 supporting the inspection wafer 100 based on the calculated correction amount (transfer step) and then perform the imaging step, the calculation step and the correction step in that order. These steps may be repeatedly performed. By repeating these steps, the teaching accuracy is improved.

Next, the fork 13 supporting the inspection wafer 100 retreats from the process module 20 and enters the load-lock module 40 maintained in a vacuum state. Next, the three lift pins 42 protrude beyond the upper surface of the stage 41 to lift and separate the inspection wafer 100 from the fork 13. Thereafter, the fork 13 retreats from the load-lock module 40 and the three lift pins 42 retract below the upper surface of the stage 41. Accordingly, the inspection wafer 100 is mounted on stage 41.

Next, the pressure in the load-lock module 40 is increased to an atmospheric pressure, and the three lift pins 42 protrude beyond the upper surface of the stage 41 to lift the inspection wafer 100. Then, the fork 37 of the transfer mechanism 35 enters the load-lock module 40. Thereafter, the three lift pins 42 are lowered to allow the inspection wafer 100 to be supported by the fork 37.

Next, the fork 37 supporting the inspection wafer 100 enters the FOUP, and the inspection wafer 100 is accommodated in the FOUP mounted on the load port 31.

As described above, in the teaching method according to the embodiment of the present disclosure, the inspection wafer 100 having the cameras 102 on the outer peripheral edge thereof is transferred to the transfer position where the wafer is transferred between the fork 13 of the transfer mechanism 11 and the lift pins 22 of the stage 21. Next, a part of the stage 21 which includes the outer periphery of the stage 21 is imaged by the cameras 102 at the transfer position. Then, the central position 21Z of the stage 21 is calculated based on the images of the stage 21 obtained by the cameras 102, and the transfer position is corrected based on the calculated central position 21Z of the stage 21 and the central position 100Z of the inspection wafer 100 at the transfer position. In other words, the transfer position where the wafer is transferred between the fork 13 and the lift pins 22 is taught based on a partial image of the stage 21 which includes the outer periphery of the stage 21. Therefore, it is possible to teach the transfer position where the wafer is transferred between the transfer mechanism 11 and the stage 21 without performing treatment on the stage 21. Accordingly, the teaching of the transfer mechanism 11 can be performed even when it is difficult to perform the treatment on the stage 21 in the process module 20 since it may affect a processing result. In addition, since the cameras 102 are installed at the inspection wafer 100, it is not required to provide cameras in a plurality of chambers of the substrate processing system 1 to correct the transfer positions in the chambers.

Since the cameras 102 image a part of the stage 21 which includes the outer periphery of the stage 21 and the transfer position is taught based on the images obtained by the cameras 102, it is not necessary to image the entire stage 21 by the cameras 102. Therefore, it is possible to perform close-up imaging, and the imaging can be performed at the transfer position (height) above the stage 21. Accordingly, it is possible to perform imaging even in a processing chamber with a height limit. On the other hand, in the case of imaging a plurality of portions on the outer periphery of the stage 21 by one camera, it is required to image the entire circumference of the wafer, and it is difficult to perform imaging at the transfer position (height).

The above embodiment has described the case in which the calculation step and the correction step are performed in real-time by imaging a part of the stage 21 which includes the outer periphery of the stage 21 at the transfer position by the cameras 102 and transmitting the captured image of the stage 21 to the control unit 50. However, when the inspection wafer 100 is not provided with a communication device, the calculation step and the correction step may be performed by storing the captured image of the stage 21 in the storage unit of the inspection wafer 100, accommodating the inspection wafer 100 in the FOUP, and acquiring a partial image including the outer periphery of the stage 21 obtained by the cameras 102 from the storage unit.

Further, the above embodiment has described the case of correcting the positional deviation of the transfer mechanism 11 with respect to the stage 21 in the process module 20. However, the present disclosure is not limited thereto. For example, the teaching method according to the embodiment of the present disclosure can also be applied to the case of correcting the positional deviation of the transfer mechanism 35 with respect to the stage 41 in the load-lock module 40.

Figure 5:
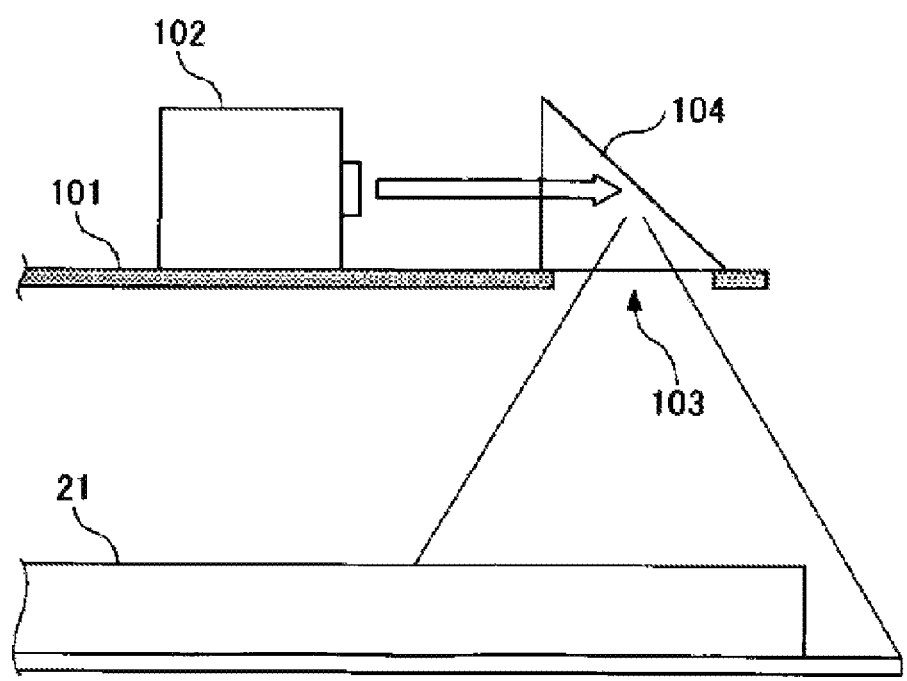
FIG. 5 shows another example of the inspection wafer.

Moreover, the above embodiment has described the case in which the imaging direction of the camera 102 is a downward direction. However, the present disclosure is not limited thereto. As shown in FIG. 5, for example, the imaging direction of the camera 102 may be a horizontal direction. When the imaging direction of the camera 102 is a horizontal direction, a prism 104 may be installed on the surface of the base wafer 101, and the lower side of the base wafer 101 can be imaged through the prism 104. When the distance between the stage 21 and the inspection wafer 100 is short, it is required to select a camera having a short working distance. However, the working distance can be increased by using the reflection of the prism 104 by setting the imaging direction of the camera 102 to the horizontal direction. Therefore, types of cameras that can be selected can be increased. Accordingly, even when the distance between the stage 21 and the inspection wafer 100 at the transfer position is short, it is possible to image a part of the stage 21 which includes the outer periphery of the stage 21 by a small camera.

It is preferable that a touch sensor is installed on the lower surface of the inspection wafer 100. In this case, in the process module 20, the three lift pins 22 slowly protrude beyond the upper surface of the stage 21 so that the contact between the three lift pins 22 and the lower surface of the inspection wafer 100 can be detected by the touch sensor. Accordingly, in the process module 20, it is possible to teach the vertical transfer position (height) between the three lift pins 22 and the fork 13. Further, in the process module 20, the fork 13 supporting the inspection wafer 100 is lowered from the position above the stage 21 in a state where the three lift pins 22 protrude to a predetermined height (e.g., the wafer transfer height) so that the contact between the lift pins 22 and the lower surface of the inspection wafer 100 can be detected by the touch sensor. Accordingly, in the process module 20, it is possible to teach the vertical transfer height between the three lift pins 22 and the fork 13 to the transfer mechanism 11. Further, the wafer transfer height in the vertical direction between the three lift pins 42 and the forks 13 and 37 in the load-lock module 40 can be taught in the same manner as in the case of the process module 20. When the touch sensor is installed on the lower surface of the inspection wafer 100, the touch position of the lift pins 22 can be accurately detected. Therefore, the vertical teaching as well as the horizontal teaching of the transfer position can be performed by using one inspection wafer 100. Accordingly, the number of inspection wafers 100 prepared for a single teaching process can be reduced.

Figure 6A:
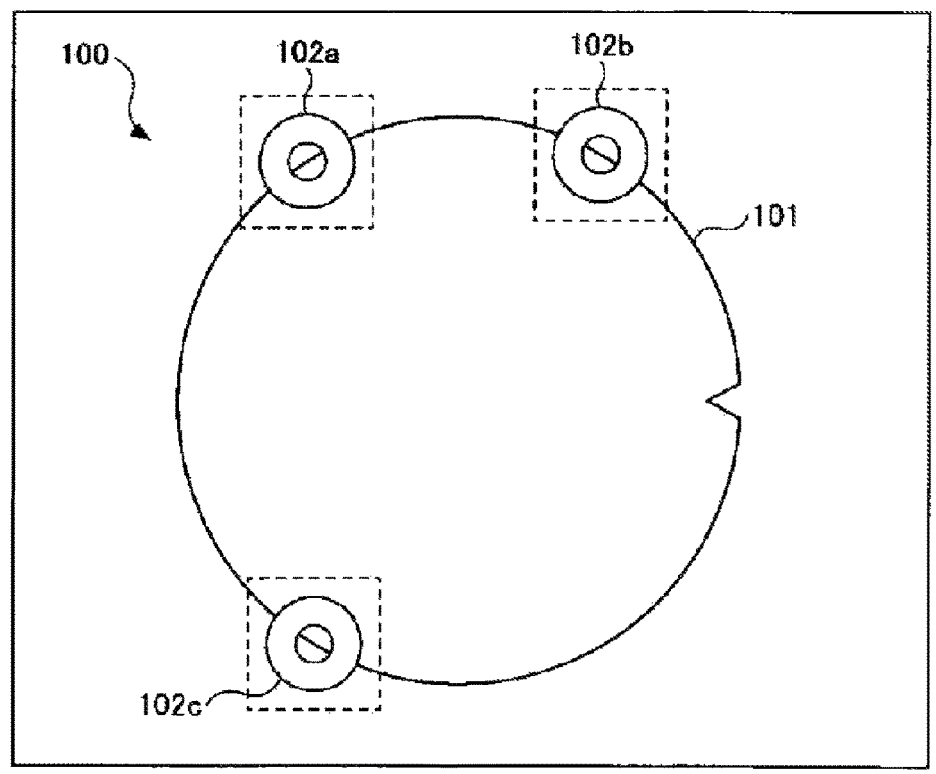
FIGS. 6A and 6B explain a method for calibrating installation positions of imaging devices.
Figure 6B:
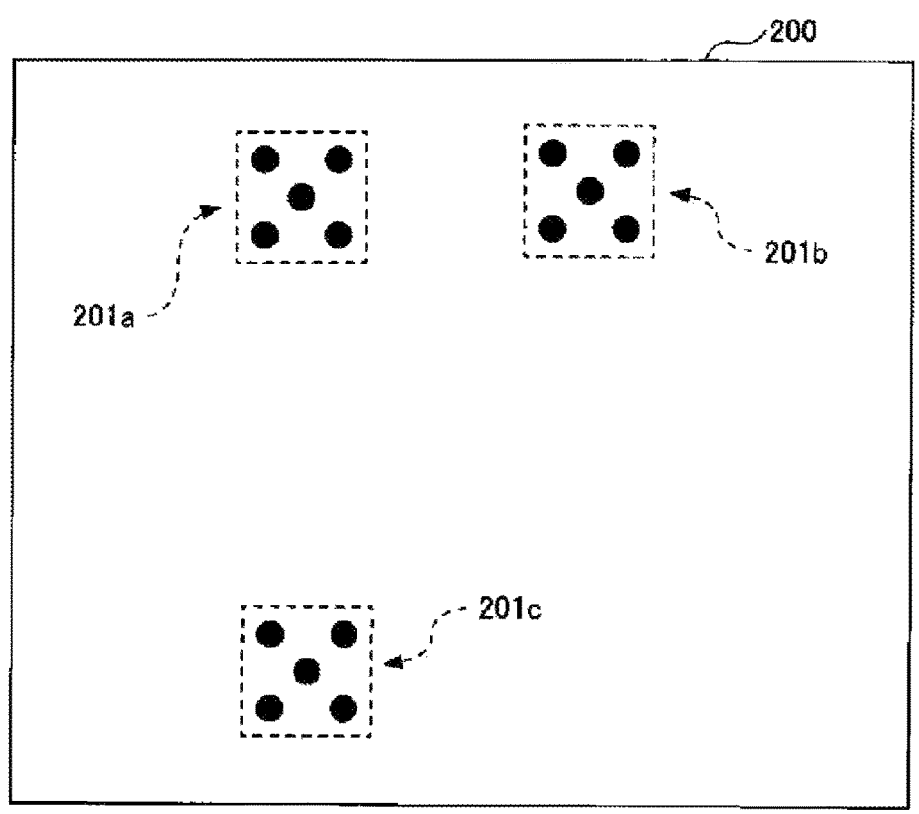

Next, a method for calibrating deviation of actual installation positions with respect to designed positions of the cameras 102 (calibration step) will be described. FIGS. 6A and 6B explain a method for calibrating the installation positions of the cameras. FIG. 6A explains the positions of three cameras 102 installed at the base wafer 101. FIG. 6B shows an example of a calibration sheet for calibrating the installation positions of the cameras 102.

As shown in FIG. 6A, in the inspection wafer 100, three cameras 102a, 102b and 102c are arranged on the same circumference of the outer peripheral edge of the surface of the base wafer 101.

As shown in FIG. 6B, on the calibration sheet 200, calibration patterns (hereinafter, referred to as "calibration indices 201a, 201b and 201c") are provided at positions corresponding to the designed positions of the three cameras 102a to 102c. As shown in FIG. 6B, for example, the calibration indices 201a to 201c may be a pattern in which a plurality of dots is periodically arranged. However, the correction indices 201a to 201c are not limited thereto, and may be, e.g., a cross mark or the like.

It is preferable to perform the calibration step before the transfer step. In the calibration step, the calibration indices 201a to 201c installed on the calibration sheet 200 are imaged by the cameras 102a to 102c arranged on the inspection wafer 100, respectively. Next, the actual camera image (actual image) of the calibration indices 201a to 201c is compared with the expected image (ideal image) that can be calculated from the postures of the cameras 102a to 102c or the positional relation with the calibration indices 201a to 201c. Next, the deviation of the actual installation positions with respect to the designed positions of the cameras 102a to 102c is calibrated to make the actual image coincide with the ideal image. By performing the calibration step, the deviation of the actual installation positions with respect to the designed positions of the cameras 102a to 102c is calibrated. Accordingly, the influence of the installation error of the cameras 102 or the like on the base wafer 101 can be eliminated. As a result, the correction accuracy of the transfer position in the correction step is improved.

In the above embodiments, the stages 21 and 41 are an example of the mounting table; the inspection wafer 100 is an example of the inspection substrate; the cameras 102 are an example of the imaging device; and the prism 104 is an example of the reflector.

While the embodiments for implementing the present disclosure have been described, the above contents do not limit the contents of the present disclosure, and various modifications and improvements can be made within the scope of the present disclosure.

The above embodiment has described the case in which the substrate is a semiconductor wafer. However, the present disclosure is not limited thereto. For example, the substrate may be a glass substrate, an LCD substrate, or the like.

While the present disclosure has been shown and described with respect to the embodiments, it will be understood by those skilled in the art that various changes and modifications may be made without departing from the scope of the present disclosure as defined in the following claims.

What is claimed is:

1. A teaching method for a transfer mechanism that transfers a substrate to a mounting table, the method comprising:
    transferring an inspection substrate having a plurality of imaging devices on an outer peripheral edge thereof to a transfer position where the substrate is transferred between the transfer mechanism and the mounting table;
    imaging a part of the mounting table which includes an outer periphery of the mounting table at the transfer position by the imaging devices;
    calculating a central position of the mounting table based on an image obtained by the imaging devices; and
    correcting the transfer position based on the central position of the mounting table which is calculated in said calculating and a central position of the inspection substrate at the transfer position.

2. The teaching method of claim 1, therein the imaging devices are arranged on the same circumference.

3. The teaching method of claim 1, wherein the imaging devices simultaneously image different portions of the mounting table.

4. The teaching method of claim 1, wherein the imaging devices image the mounting table through a reflector.

5. The teaching method of claim 1, wherein the mounting table is provided in a processing chamber in which predetermined processing is performed on the substrate.

6. The teaching method of claim 1, therein the transfer position is separated upward by a predetermined distance from a surface of the mounting table on which the substrate is mounted.

7. The teaching method of claim 1, wherein said transferring, said imaging, said calculating and said correcting are repeated in that order.

8. The teaching method of claim 1, further comprising, before said transferring, position-aligning the inspection substrate.

9. The teaching method of claim 1, further comprising, before said transferring, calibrating deviation of actual installation positions of the imaging devices on the inspection substrate with respect to designed positions of the imaging devices on the inspection substrate.

10. The teaching method of claim 1, wherein the inspection substrate has a communication device configured to transmit the image obtained by the imaging devices to an external device.

11. The teaching method of claim 1, wherein the inspection substrate has the same size as the size of the substrate.

12. The teaching method of claim 1, wherein the inspection substrate is provided with a touch sensor.

* * * * *